(12) United States Patent
Bhogal

(10) Patent No.: US 7,006,350 B2
(45) Date of Patent: Feb. 28, 2006

(54) PC CARD SLOT ASSEMBLY AND ACCOMPANYING SYSTEM

(75) Inventor: Kulvir Singh Bhogal, Fort Worth, TX (US)

(73) Assignee: Lenovo(Singapore) Pte. Ltd., Singapore (SG)

( * ) Notice: Subject to any disclaimer, the term of this patent is extended or adjusted under 35 U.S.C. 154(b) by 27 days.

(21) Appl. No.: 10/655,374

(22) Filed: Sep. 4, 2003

(65) Prior Publication Data

US 2005/0052836 A1    Mar. 10, 2005

(51) Int. Cl.
*G06F 1/16*    (2006.01)
(52) U.S. Cl. .................. 361/683; 439/988; 710/104
(58) Field of Classification Search ........ 361/679–687, 361/724–727; 345/156–157, 168–169, 903, 345/905; 364/708.1; 439/988, 32; 710/104
See application file for complete search history.

(56) References Cited

U.S. PATENT DOCUMENTS

| | | | |
|---|---|---|---|
| 3,984,658 A | * | 10/1976 | Cannon .................. 235/382 |
| 5,183,404 A | | 2/1993 | Aldous et al. ............ 439/55 |
| 5,861,873 A | * | 1/1999 | Kikinis ................... 345/157 |
| 6,259,598 B1 | * | 7/2001 | Beaman et al. .......... 361/683 |
| 6,324,064 B1 | | 11/2001 | Schneider ............... 361/737 |
| 2002/0001979 A1 | * | 1/2002 | Akram et al. ............ 439/32 |
| 2003/0037196 A1 | | 2/2003 | Chung .................... 439/32 |

* cited by examiner

*Primary Examiner*—Hung Van Duong
(74) *Attorney, Agent, or Firm*—Lally & Lally, L.L.P.; Carlos Munoz Bustamante

(57) ABSTRACT

A data processing device includes a chassis defining a card slot opening and a card received within the chassis. The card slot is operable to receive a peripheral card in a functional position in which a portion of the peripheral card is external to the chassis and the peripheral card is electrically connected to the system. The card slot is further operable to receive the peripheral card in a housed position wherein the peripheral card is entirely enclosed within the chassis. An embodiment of the card slot further includes means, such as a push button, for transitioning the peripheral card from the housed position to the functional position. In one embodiment, the peripheral is disconnected from the system and from electrical power when in the housed positioned.

14 Claims, 2 Drawing Sheets

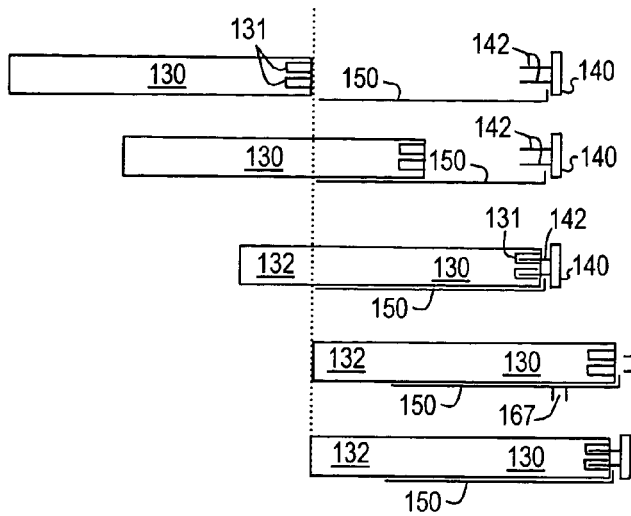
FIG. 6
FIG. 7
FIG. 8
FIG. 9
FIG. 10
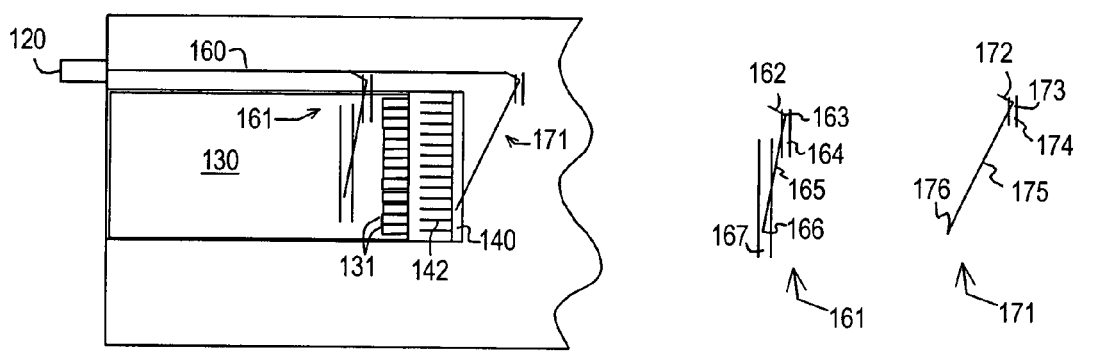
FIG. 11   FIG. 12   FIG. 13
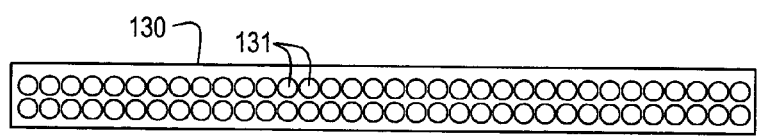
FIG. 14

PC CARD SLOT ASSEMBLY AND ACCOMPANYING SYSTEM

BACKGROUND

1. Field of the Present Invention

The present invention is in the field of computing devices and more particularly in the field of computing devices having PC card slots.

2. History of Related Art

The Personal Computer Memory Card International Association (PCMCIA) develops standards for low-cost, credit card-sized, interchangeable computer peripheral devices called PC Cards. The published specification for these devices is called the PC Card Standard. The PC Card Standard specifies the electrical and mechanical interface between the PC Card device and the socket it is plugged into. The standard also defines the software support needed to configure and control the device. The PCMCIA software architecture enables PC Cards to be configured dynamically at the time of insertion, thus providing hot-plugging capability. Hot plugging allows users to add (or remove) peripheral devices to their computer system without rebooting it.

A PC Card is a peripheral device that can add a wide variety of capabilities to computers including memory, mass-storage, LAN, fax/modem and wireless communications. Although PC Cards can be implemented in a variety of computing devices, they are most prevalent in notebook and laptop PC's and other mobile computing devices. The standardized PC card is roughly the dimensions of a credit card, and has a standardized 68-pin connector at one end. To allow manufactures to add functions and technologies in the PC Card form factor, PCMCIA has defined three PC Card types. All three types are the same length and width and are 3.3 mm thick along their guide rails and connector ends so they can be inserted into standard PCMCIA slots. The Type I card is a constant 3.3 mm thick and is commonly used for memory. The Type II card is 5 mm thick to accommodate applications that require slightly more room for components such as fax/modem and network cards. The Type III card is 10.5 mm thick to accommodate higher-profile communication devices such as rotating storage media and wireless communication devices.

More recently, the PCMCIA has recommended extensions to the PCMCIA Type I and II Card Types. The extended cards are identical to the regular cards with the exception of their length. The extended cards are typically 50 mm longer than the regular cards, although longer and shorter extended cards may exists. The primary uses for the card involve applications that need components outside of the systems or simply more room for internal components. Among the more common of these extended cards are wireless network interface cards that connect notebook and laptop PC's to a local area network.

While it may be desirable or necessary to have a portion of some PC cards exposed to the environment during operation, there are clear risks associated with a peripheral device that extends beyond the boundaries of the computer in which it is installed, especially in the context of mobile computing devices such as notebook computers. Specifically, the exposed portion of a PC card is susceptible to mechanical stress or damage at any time, but especially during times when the computer is being packed or transported. A solution to this problem is to remove the PC card whenever it is not in use, but this solution has obvious drawbacks including the increased risk of loss when the PC card is separated from the computer and the time required for the operating system to recognize the device when it is later reinserted (PC cards are designed for plug and play compatibility). It would be desirable to implement a mechanism and apparatus for preventing PC Cards and extend PC Cards from being exposed to the environment when not in use.

SUMMARY OF THE INVENTION

The objective identified above is achieved according to the present invention by a data processing device that includes a chassis defining a card slot opening and a card slot received within the chassis. The card slot is operable to receive a peripheral card in a functional position in which a portion of the peripheral card is external to the chassis and the peripheral card is electrically connected to the system. The card slot is further operable to receive the peripheral card in a housed position wherein the peripheral card is entirely enclosed within the chassis. An embodiment of the card slot further includes means, such as a push button, for transitioning the peripheral card from the housed position to the functional position. The push button causes displacement of the peripheral card and displacement of a peripheral card connector, where the two displacements differ such that the connector is connected to the peripheral card in the functional position and disconnected from the connector in the housed position. The card slot may be employed within a notebook computer.

BRIEF DESCRIPTION OF THE DRAWINGS

Other objects and advantages of the invention will become apparent upon reading the following detailed description and upon reference to the accompanying drawings in which:

FIGS. 6–10 illustrate various stages in positioning the peripheral card within a card slot of the data processing system;

FIGS. 11–13 depict one embodiment of a mechanism for disconnecting a connector from the peripheral card when the peripheral card is moved to the housed position of FIGS. 4 and 5; and FIG. 14 illustrates the connector sockets of a PCMCIA embodiment of the peripheral card of FIGS. 2 through 10.

Figure 1:
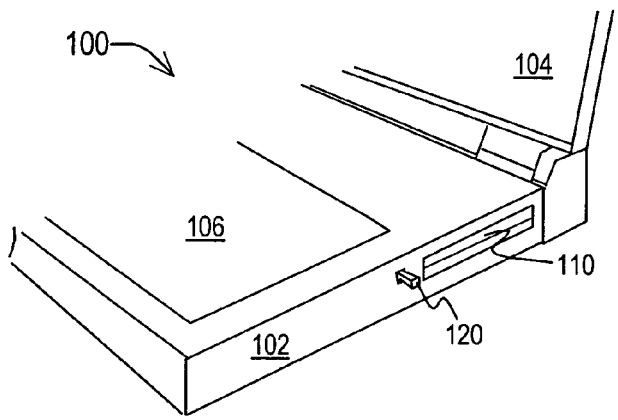
FIG. 1 is a perspective view of a data processing system having a peripheral card slot according to one embodiment of the invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention contemplates a PC card slot that employs at least two insertion positions including a "housed" position in which the PC card is fully enclosed within the host computer and a "functional" position in which a portion of the PC card is external to the host computer. In one embodiment, the PC card is electrically disconnected from the host computer when it is in the housed position and becomes electrically connected when the card is moved from the housed position to the functional position. The PC card slot of the host computer may employ a push rod that is extended to a first position (fully extended) when the PC card is in the housed position. By forcing the push rod from the first position to a second position (partially extended), the PC card is moved from the housed position to the functional position. Further depression of the push rod ejects the card from the host computer. In any of the positions, the push rod may be "folded" so that it does not extend beyond the boundaries of the host computer.

Referring now to the drawings, FIG. 1 is a perspective view of a host computing device (system) 100 suitable for use with the present invention. In the depicted embodiment, host computing device (system) 100 is represented by a notebook computer. In other implementations, host computing device (system) 100 may be any computing device, especially a mobile computing device, having peripheral card slots such as PCMCIA compliant card slots. Host computing device (system) 100 as depicted in FIG. 1 includes a chassis 102, a display 104, and a keyboard represented by reference numeral 106. In the depicted embodiment, a side of chassis 102 defines a hole suitable for receiving a PC card slot 110 of system 100. A push button 120 adjacent PC card slot 110 is used to eject a PC card inserted in card slot 110 and, according to the present invention, to move the PC card from a first position, in which the PC card is fully enclosed within chassis 102 and may or may not be capable of communicating with a central processing unit (CPU) of system 100 (via a connector that is coupled directly to a system bus or indirectly through one or more peripheral busses and bus bridges), to a second position in which a portion of the PC card is external to chassis 102 and the PC card is electrically coupled to the CPU. In this embodiment, PC card slot 110 can be used to house, for example, an extended PC Card within the chassis while simultaneously disconnecting the card electrically to reduce power consumption.

Figure 2:
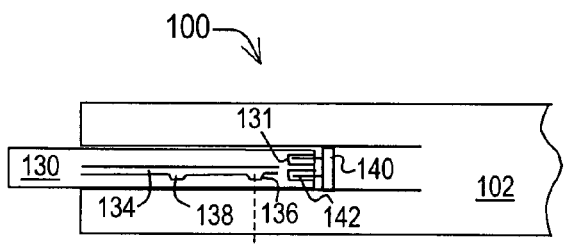
FIGS. 2 and 3 are side and top section views illustrating the system of FIG. 1 wherein a peripheral card is in a functional position.
Figure 3:
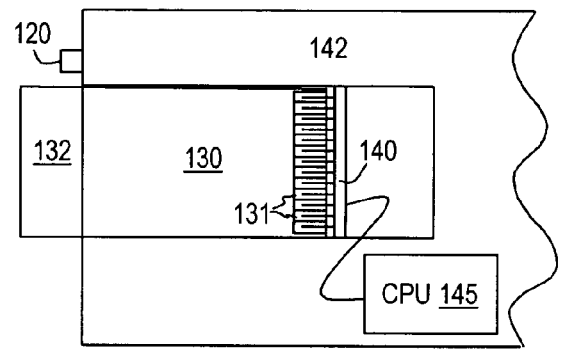
Figure 4:
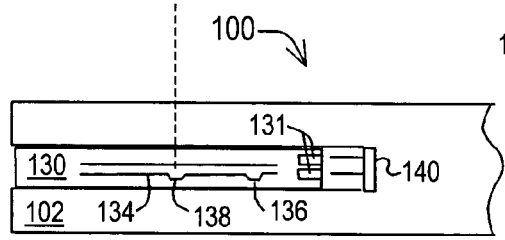
FIGS. 4 and 5 are side and top sectional views illustrating the system of FIG. 1 wherein the peripheral card of FIGS. 2 and 3 is in a housed position.
Figure 5:
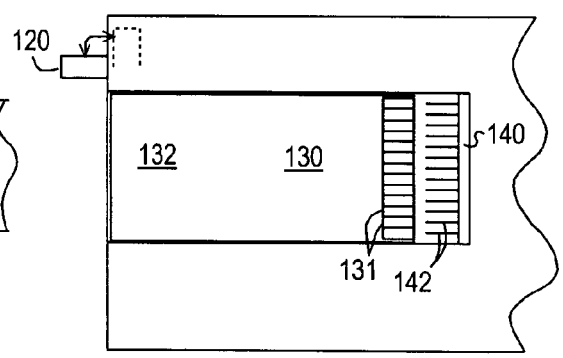

FIGS. 2 and 3 illustrate side and top cross sectional views of a configuration in which a PC card 130 is received in card slot 110 (see FIG. 1) of system 100 with a portion 132 of PC card 130 external to chassis 102 while FIGS. 4 and 5 illustrate a configuration in which the PC card 130 is fully received within card slot 110. These two configurations represent the primary configurations that are relevant to the present invention. PC card 130 is, in one embodiment, a PCMCIA compliant PC card and, more specifically, an extended PCMCIA card. The figures depict a Type I PC card having a uniform thickness. Other embodiments (not depicted) are suitable for use with Type II and Type III PC cards.

In the configuration depicted in FIGS. 2 and 3, in which a portion 132 of PC card 130 is exposed to the environment, PC card 130 is electrically coupled and, therefore, able to communicate with a CPU 145 of system 100. This electrical connection is achieved via the pins 142 of a PC card connector 140 that is housed within card slot 110. It will be appreciated that the connection between PC card 130 and CPU 145 may traverse one or more peripheral busses and bus bridges (not shown) as well as a system bus to which CPU 145 is connected. A conventional PC card 130, as depicted in FIG. 14, includes two rows of 34 connector sockets 131. PC card connector 140 includes a similarly arranged set of pins 142 (i.e., a pin 142 for each connector socket 131). Electrical connection of PC card 130 to system 100 is achieved when pins 142 are received within their corresponding connector sockets 131. In an embodiment in which PC card 130 is PCMCIA compliant, PC card 130 likely does not have an internal source of voltage or electrical power. Power is supplied to PC card 130 through PC card connector 140, which is electrically connected to one or more components of system 100 such as a bus bridge to which a CPU is also connected. In this configuration, PC card 130 draws power whenever it is connected to connector 140 and normal operating power to system 100 is enabled. Conversely, PC card 130 does not draw power unless it is connected to connector 140. The present invention emphasizes reduced power consumption in one embodiment by disconnecting PC card 130 from power (i.e., disconnecting the PC card from connector 140) when the card is in a non-operational, "housed" position.

Referring to FIGS. 4 and 5, a configuration in which PC card 130 is received in card slot 110, entirely enclosed by chassis 102, and disconnected from PC card connector 140 is shown. Comparing FIG. 2 and FIG. 4, the insertion of the entire PC card 130 (including portion 132) into chassis 102 results in the disconnection of connector 140 from PC card sockets 131. In the depicted embodiment, the displacement of PC card 130 required to enclose card portion 132 within chassis 102 is accompanied by an even greater displacement of connector 140 such that the connector pins 142 disengage PC card sockets 131 as PC card 130 is inserted fully into card slot 110.

FIGS. 2 and 4 also show a guide channel 134 on a side of PC card 130. The depicted guide channel 134 includes a first notch 136 and a second notch 138 that facilitate the transition of PC card 130 from its first or functional position to its second or housed position. More specifically, guide channel 134 is configured to engage a retractable and preferably spring-loaded guide pin (not shown) that protrudes from a sidewall of PC card slot 110. When the PC card 130 is in its functional position with portion 132 extending beyond the confines of chassis 102, the guide pin is engaged in first notch 136. When PC card 130 is subsequently inserted fully within chassis 102, the guide pin disengages from first notch 136 and eventually engages second notch 138.

As seen in FIGS. 1, 3, and 5, a push button 120 is positioned adjacent card slot 110. In the depicted embodiment, push button 120 is partially extended when PC card 130 is in the functional position shown in FIG. 3 and fully or more fully extended when PC card 130 is in the housed position shown in FIG. 5. Push button 120 is preferably operable to eject PC card 130 from card slot 110 by pressing push button 120 as is the case for some conventional PC card slots. In addition, however, push button 120 according to the present invention is also operable to move PC card 130 from the "housed" position (FIG. 5) to the functional position (FIG. 3) by depressing push button 120 from the more fully extended position (FIG. 5) to the partially extended position (FIG. 3). In addition, push button 120 is preferably rotatable, as shown in FIG. 5, between an extended position, represented by the solid line, and an enclosed position, represented by the dashed line.

Referring now to FIGS. 6–10, a series of cross sectional views illustrates a transition of PC card 130 from an ejected position as shown in FIG. 6 to fully inserted positions shown in FIGS. 9 and 10. Initially, PC card 130 is external to card slot 110 and chassis 102 represented by the dotted line extending from FIG. 6 to FIG. 10. As PC card 130 is inserted into the card slot (FIG. 7), a carriage plate 150 provides support for the card before the card sockets 131 reach the connector pins 142. When PC card 130 reaches its functional position (FIG. 8), the connector pins 142 engage sockets 131. In this position, PC card 130 also engages a lip 152 of carriage plate 150. Further insertion of PC card 130 causes carriage plate 150 to move with the PC card 130.

In an embodiment depicted in FIGS. 11–13, a pair of crank and slider mechanisms are employed to effect a disconnect of the pins 142 from PC card sockets 131 as PC card 130 is moved from the functional position of FIG. 8 to the housed position of FIG. 10. In this embodiment, a push rod 160 attached to push button 120 connects the push button to a pair of modified crank and slider assemblies 161 and 171. The first assembly 161 is arranged to move carriage plate 150 a first displacement when push button 120 is pushed from an extended position (see FIG. 5) corresponding to the PC card's housed position to the partially extended position (see FIG. 3) corresponding to the PC card's functional position. The second assembly 171 is configured to move PC card connector 140 a second displacement when the push button is pressed from the housed position to the functional position. The assemblies 161 and 171 have different geometries that produce different displacements. More specifically, the displacement of connector 140 is greater than the displacement of carriage plate 150 when push button 120 is depressed. The difference in displacement causes connector pins 142 to mate with sockets 131 in the functional position and to disengage from the sockets in the housed position.

As shown in FIG. 12, the depicted crank and slider mechanism includes a crank link 162 attached to a displacement link 165. The angle between links 162 and 165 is fixed, but a pivot point 163 is confined within a fixed position track 164. An endpoint 166 of displacement link 165 resides in a track 167 formed on a lower surface of carriage plate 150. As push rod 160 turns crank link 162, displacement link 165 rotates causing track 167 and the carriage plate 150 to which track 167 is attached to translate. Similarly, second assembly 171 includes a crank link 172, a pivot point 173 located within a fixed track 174, and a displacement link 175 having an end point 176. End point 176 in the depicted embodiment engages a track formed in connector 140. As push rod 160 turns crank link 172, the rotation of displacement link 175 causes a translation of connector 140. By adjusting the relative dimensions of the crank links 162 and 172, the displacement links 165 and 175, and the angles between the respective crank and displacement links, the difference in the displacement of carriage plate 150 and connector 140 is controlled to achieve the desired result in which electrical connection to PC card 130 is made in the functional position but not in the housed positioned. This embodiment is desirable in configurations that employ PC cards that require or benefit from exposing a portion of the card to the environment during operating. A wireless network card, for example, may include an antenna that performs best when exterior to chassis 102. When this type of PC card is housed, the reduced performance suggests that it might be better to simply turn off power to the card when housed in an effort to conserve power consumption. In an embodiment represented by FIG. 10, however, the PC card may be fully or adequately functional even in the housed position. In this embodiment, it may be desirable to maintain electrical connection to PC card 130 in the housed position. This result could be achieved, for example, by configuring the assemblies 161 and 171 with substantially similar dimensions so that carriage plate 150 and connector 140 move substantially in unison.

Although the depicted embodiment achieves electrical connection and disconnection of the PC card with slider crank type assemblies, the choice of mechanisms to achieve the differential in displacement is implementation specific and other mechanical or electro-mechanical means may be used within the scope of the present invention. Similarly, although the depicted embodiment is illustrated with respect to a uniform thickness (Type I) PC card, the invention is intended to encompass conventional and extended versions of Type II and Type III PC cards as well as peripheral devices that do not conform to the PCMCIA specification.

It will be apparent to those skilled in the art having the benefit of this disclosure that the present invention contemplates a mechanism for protecting PC card type adapters by allowing them to be housed within the computer chassis while simultaneously disconnecting them from system power to conserve energy. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A data processing system, comprising:
    a chassis defining a card slot opening;
    a card slot received within the chassis and the card slot opening;
    wherein the card slot is operable to receive a peripheral card in a functional position wherein a portion of the peripheral card is external to the chassis and further wherein the peripheral card is electrically connected to the system and further wherein the card slot is operable to receive the peripheral card in a housed position wherein the peripheral card is entirely enclosed within the chassis;
    wherein the card slot further includes a push button operable to transition the peripheral card from the housed position to the functional position;
    wherein the push button is connected to a push rod that drives a first slider crank assembly that causes displacement of the peripheral card when the push button is pushed.

2. The data processing system of claim 1, wherein the push rod is further connected to a second slider crank assembly that causes displacement of a peripheral card connector when the push button is pushed.

3. The data processing system of claim 2, wherein the peripheral card displacement and the peripheral card connector displacement differ wherein the connector is connected to the peripheral card in the functional position and disconnected from the connector in the housed position.

4. The data processing system of claim 3, wherein the system comprises a notebook computer and the card slot comprises a PCMCIA compliant card slot.

5. The data processing system of claim 4, wherein the peripheral card comprises a wireless network card having an antenna within the portion that is external to the chassis when the peripheral card is in the functional position.

6. A card slot assembly for use with data processing system having a chassis and a central processing unit (CPU)

within the chassis, wherein the card slot is suitable for receiving a peripheral card through an opening in the chassis, and wherein the card slot is operable to connect the peripheral card to the CPU with a portion of the peripheral card being external to the chassis and further operable to transition the peripheral card from the functional position to a housed positioned wherein the peripheral card is fully enclosed within the chassis and electrically disconnected from a source of electrical power;

wherein the card slot further includes a push button operable to transition the peripheral card from the housed position to the functional position; and wherein the push button is connected to a push rod that drives a first slider crank assembly that causes displacement of the peripheral card when the push button is pushed.

7. The card slot assembly of claim 6, wherein the push rod is further connected to a second slider crank assembly that causes displacement of a peripheral card connector when the push button is pushed.

8. The card slot assembly of claim 7, wherein the peripheral card displacement and the peripheral card connector displacement differ wherein the connector is connected to the peripheral card in the functional position and disconnected from the connector in the housed position.

9. The card slot assembly of claim 8, wherein the system comprises a notebook computer and the card slot comprises a PCMCIA compliant card slot.

10. The card slot assembly of claim 9, wherein the peripheral card comprises a wireless network card having an antenna within the portion that is external to the chassis when the peripheral card is in the functional position.

11. A notebook computer, comprising:

a chassis;

a central processing unit (CPU);

a PC card slot, accessible through the chassis, including a card slot connector electrically coupled to the CPU, wherein the card slot is operable to receive a PC card in a first position with the PC card connected to the connector and a portion of the PC card external to the chassis and further wherein the card slot is operable to convey the PC card to a housed position entirely within the chassis wherein the PC card is disconnected from electrical power in the housed position;

wherein the card slot further includes a push button operable to transition the peripheral card from the housed position to the functional position; and wherein the push button is connected to a push rod that drives a first slider crank assembly that causes displacement of the peripheral card when the push button is pushed.

12. The computer of claim 11, wherein the push rod is further connected to a second slider crank assembly that causes displacement of a peripheral card connector when the push button is pushed.

13. The computer of claim 12, wherein the peripheral card displacement and the peripheral card connector displacement differ wherein the connector is connected to the peripheral card in the functional position and disconnected from the connector in the housed position.

14. The computer of claim 13, wherein the peripheral card comprises a wireless network card having an antenna within the portion that is external to the chassis when the peripheral card is in the functional position.

* * * * *